United States Patent [19]

Kawai

[11] Patent Number: 4,916,499
[45] Date of Patent: Apr. 10, 1990

[54] JUNCTION FIELD EFFECT TRANSISTOR WITH VERTICAL GATE REGION

[75] Inventor: Hiroji Kawai, Kanagawa, Japan

[73] Assignee: Sony Corporation, Tokyo, Japan

[21] Appl. No.: 405,082

[22] Filed: Sep. 6, 1989

Related U.S. Application Data

[63] Continuation of Ser. No. 111,027, Oct. 21, 1987, abandoned.

[30] Foreign Application Priority Data

Oct. 23, 1986 [JP] Japan .............................. 61-252378
Feb. 18, 1987 [JP] Japan .............................. 62-35386

[51] Int. Cl.$^4$ .......................................... H01L 29/80
[52] U.S. Cl. .................................. 357/22; 357/16; 357/58; 357/55
[58] Field of Search ............... 357/22 E, 22 A, 22 I, 357/22 D, 22 R, 16, 58, 55, 22 J, 22 K, 22 F, 22 L, 22 M, 22 G

[56] References Cited

U.S. PATENT DOCUMENTS

| | | | |
|---|---|---|---|
| 3,823,352 | 7/1974 | Pruniaux et al. | 357/22 D X |
| 4,259,681 | 3/1981 | Nishizawa | 357/22 C X |
| 4,459,605 | 7/1984 | Rice | 357/22 D |
| 4,620,207 | 10/1986 | Calviello | 357/22 D |
| 4,636,823 | 1/1987 | Margalit et al. | 357/22 R X |

Primary Examiner—William Mintel
Attorney, Agent, or Firm—Hill, Van Santen, Steadman & Simpson

[57] ABSTRACT

A junction field effect transistor having a source region, a gate region and a drain region, which are laminated to form a laminated layer, and a channel region formed on one side surface across the laminated layer, and also having a cavity which separates high impurity concentration regions of the source, gate and drain regions is disclosed. A method for manufacturing the above junction field effect transistor is also disclosed which has the steps of laminating semiconductor layers which become a source region, a gate region and a drain region, respectively, removing portions of the semiconductor layers other than portions which become an active region portion, and forming a channel region on one side surface across the laminated layers of the source region, gate region and drain region by the epitaxial growth method, and also forming cavities.

2 Claims, 9 Drawing Sheets

JUNCTION FIELD EFFECT TRANSISTOR WITH VERTICAL GATE REGION

This is a continuation of application Ser. No. 111,027, filed Oct. 21, 1987, now abandoned.

BACKGROUND OF THE INVENTION

1. Field of the Invention

The present invention relates to a junction field effect transistor (so-called J-FET) which can operate at high speed and the manufacturing method thereof.

2. Description of the Prior Art

The efficiency of the junction field effect transistor (J-FET) is roughly expressed by gm/Cg where gm is the mutual conductance and Cg the gate capacitance. The conventional J-FET will hereinafter be described with reference to FIG. 1.

Figure 1:
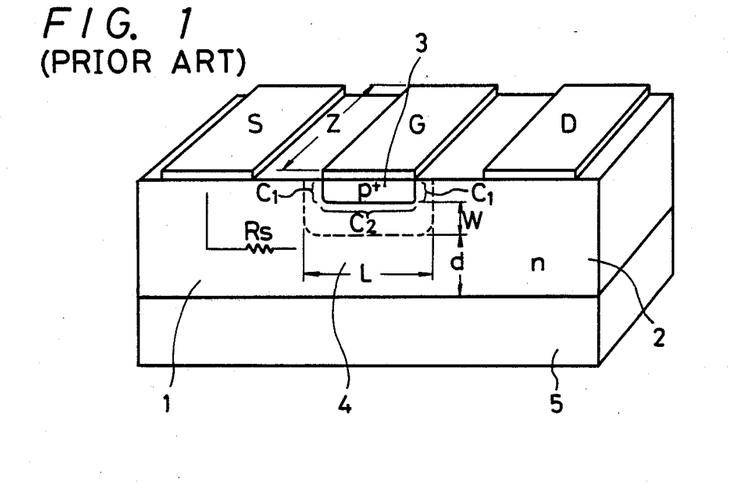
FIG. 1 is a perspective view illustrating a conventional junction field effect transistor.

Referring to FIG. 1, the J-FET comprises on a substrate 5 a source region 1, a drain region 2, a gate region 3 and a channel region 4. There are provided a source electrode S, a gate electrode G and a drain electrode D. In this case, $$Cg = \frac{2 \cdot Z \cdot L \cdot Ks \cdot \epsilon 0}{W} \quad (1)$$

$$W = \left(\frac{2Ks\epsilon 0}{qN}\right)^{\frac{1}{2}} (\phi B - Vg)^{\frac{1}{2}} \quad (2)$$

$$gm = \frac{gm^*}{Rs\,gm^* + 1} \quad (3)$$

$$gm^* = G0 \left(\frac{8Ks\epsilon 0}{qNd^2}\right)^{\frac{1}{2}} \times [(VD - \phi B - VG)^{\frac{1}{2}} - (\phi B - Vg)^{\frac{1}{2}}] \quad (4)$$

$$G0 = \frac{Zq\mu Nd}{L} \quad (5)$$

Thus, $$gm^*/Cg = \frac{(2Ks\epsilon 0)^{\frac{1}{2}}(\phi B - Vg)^{\frac{1}{2}}}{\frac{1}{2}} \times \frac{Zq\mu Nd}{L} \times \quad (6)$$

$$2Z\,L\,Ks\epsilon 0\,(qN)\left(\frac{8Ks\epsilon 0}{qNd^2}\right)^{\frac{1}{2}} [(VD - \phi B - VG)^{\frac{1}{2}} -$$

$$(\phi B - Vg)^{\frac{1}{2}}] \approx \frac{2\mu}{L^2} (\phi B - Vg)^{\frac{1}{2}} [(VD - \phi B - Vg)^{\frac{1}{2}} -$$

$$(\phi B - Vg)^{\frac{1}{2}}]$$

where z is the gate width, L the gate length, $Ks_e0$ the dielectric constant, W the thickness of the depletion layer, q the charge, N the impurity concentration, $\phi B$ the built-in voltage, Vg the gate voltage, gm° the intrinsic transconductance, G0 the channel conductance, d the effective thickness of the channel and $\mu$ the mobility. Therefore, in order to increase gm/Cg, the gate length L must be decreased as much as possible. Since the source resistance Rs lowers the effective mutual conductance gm, the source resistance Rs must be decreased. If the gate length L is decreased, the short-channel effect occurs so that when the gate is closed, a current flows through the substrate 5 just below the channel region 4. Thus, since the gate is not closed satisfactorily, the impurity concentration N must be increased and the effective thickness d of the channel must be decreased.

By the way, there can be a limit that the gate length L is decreased by the photo-lithography technique. If the electron beam lithography technique and X-ray lithography technique are utilized effectively, the gate length L can be decreased to ¼ μm. In this case, the J-FET, however, causes a problem. That is, since the gate region 3 is formed in the standard J-FET by the diffusion of impurities, the gate length L becomes longer than that of the lithography rule by diffusing the impurities in the lateral direction. Therefore, even if the gate window of ¼ μm long can be formed, the effective gate length becomes about ⅓ to ½ μm. When the J-FET having a gate length in sub-micron units is formed by the diffusion method, the side capacity C1 of the P+ gate region 3 is made significant for the intrinsic capacity C2 ($\propto 1/L$) by the diffusion of the P+ gate region 3 so that the linear improvement of the efficiency cannot be expected by the decrease of the gate length L.

OBJECTS AND SUMMARY OF THE INVENTION

Accordingly, it is an object of this invention to provide an improved junction field effect transistor which can overcome the shortcomings encountered with the conventional junction field effect transistor and the manufacturing method thereof.

It is another object of this invention to provide a junction field effect transistor which can suppress gate capacitance and short-channel effect.

It is a further object of this invention to provide a junction field effect transistor which can be operated at very high speed.

According to one aspect of the present invention, there is provided a junction field effect transistor comprising:

(a) a source region, a gate region and a drain region, said source, gate and drain regions being laminated to form a laminated layer; and (b) a channel region formed on one side surface across said laminated layer.

These and other objects, features and advantages of the present invention will become apparent from the following detailed description of the preferred embodiments to be taken in conjunction with the accompanying drawings, throughout which like reference numerals designate like elements and parts.

DESCRIPTION OF THE PREFERRED EMBODIMENTS

The present invention will now be described with reference to the attached drawings.

The first embodiment of the present invention will hereinafter be described with reference to FIGS. 2A through 2E. Also, the manufacturing method thereof will be described here.

Figure 2A:
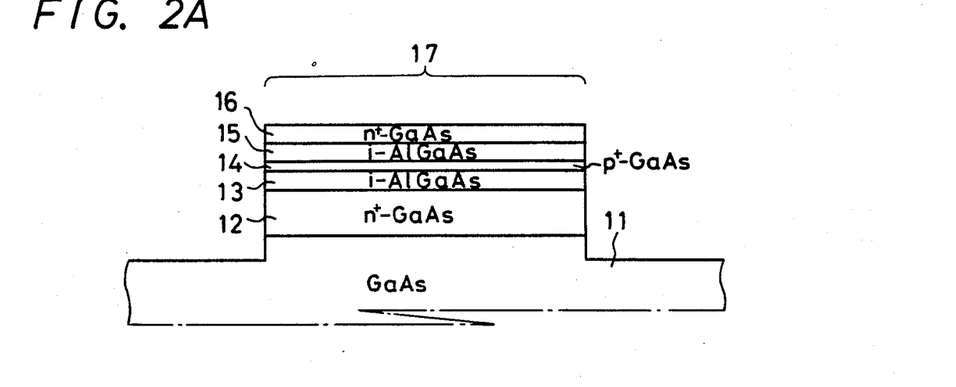
FIGS. 2A through 2F are respectively process diagrams used to explain an embodiment of a junction field effect transistor according to the present invention.

Initially, on a semi-insulating GaAs substrate 11, an n$^+$GaAs layer 12 of about 3000 Å thick and having an impurity concentration of about $5 \times 10^{18}$ cm$^{-3}$ which becomes a drain region, an i-Al$_{0.4}$Ga$_{0.6}$As layer 13 of about 1000 Å thick, a P$^+$GaAs layer 14 of about 500 Å thick and having an impurity concentration of about $5 \times 10^{19}$ cm$^{-3}$ which becomes a gate region, an i-Al$_{0.4}$Ga$_{0.6}$As layer 15 of about 200 Å thick and an n$^+$-GaAs layer 16 of about 500 Å thick and having an impurity concentration of $5 \times 10^{18}$ cm$^{-3}$ which becomes a source region are sequentially deposited according to the MOCVD (metal organic chemical vapor deposition) method, as shown in FIG. 2A. Then, the respective layers 12 to 16 are selectively etched to the substrate 11 except an active region portion 17 by, for example, the RIE (reactive ion etching) method.

Figure 2B:
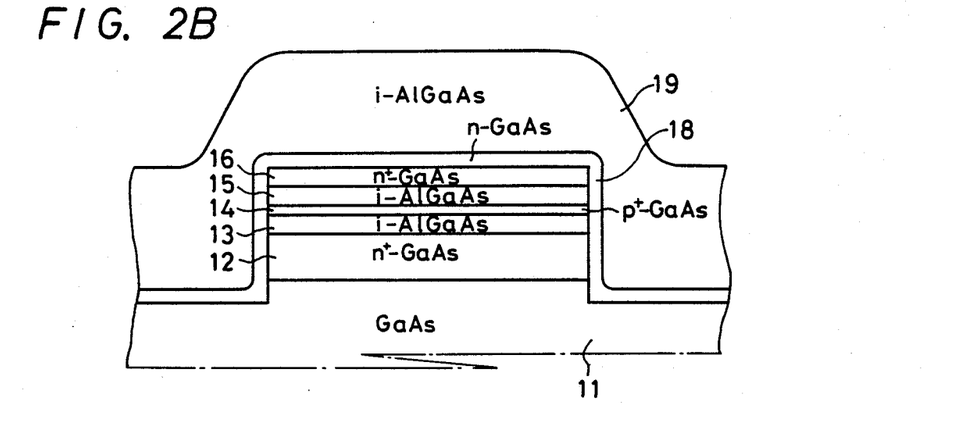

Then, as shown in FIG. 2B, after the damage layer was removed by etching of about several 100s of angstrom (thickness) by the wet etching method, the layers are again grown by the MOCVD method to thereby sequentially form the n-GaAs layer 18 of about 500 Å thick of which the impurity concentration is about $3 \times 10^{18}$ cm$^{-3}$ and an i-Al$_{0.4}$Ga$_{0.6}$As layer 19 of about 5000 Å thick. Alternatively the layer 18 may be made of an insulating material such as SiN or the like, and the layer 19 may be omitted.

Figure 2C:
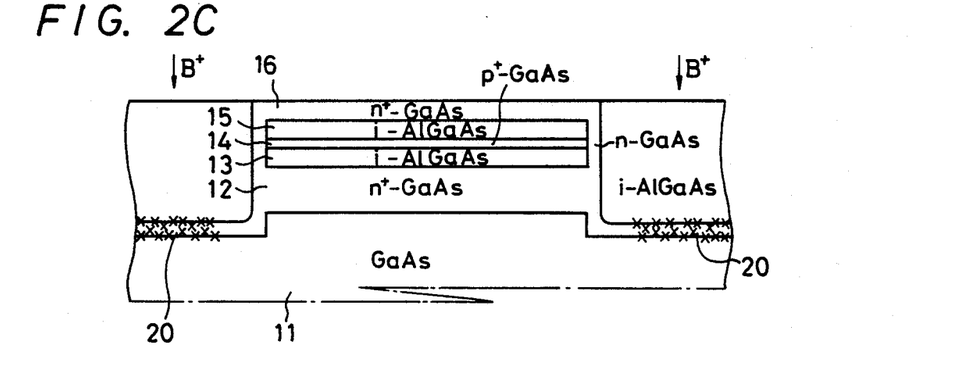

Then, as shown in FIG. 2C, boron B$^+$, for example, is implanted into a region adjacent to the active region 17 which will become an element to form an element separating region 20 and then the photo-resist is coated on its whole surface, which then is made flat by, for example, the RIE process. At that time, the n$^+$-GaAs layer 16 becomes an outer surface in the active region 17.

Figure 2D:
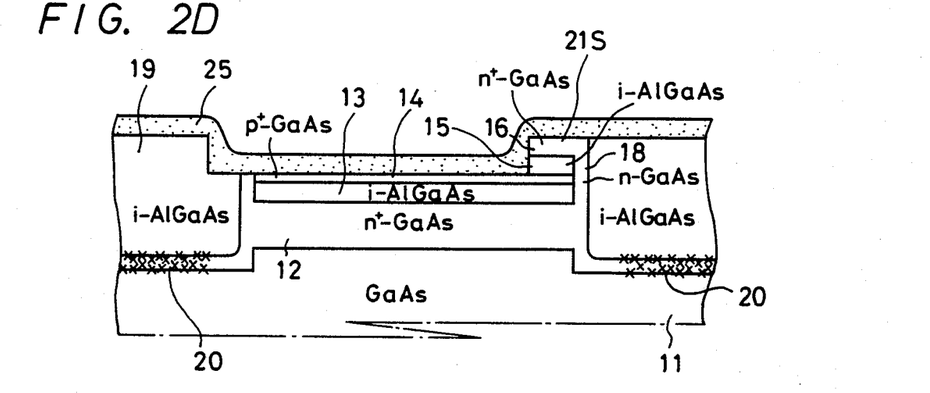

Then, as shown in FIG. 2D, the n$^+$-GaAs layer 16 and the i-Al$_{0.4}$Ga$_{0.6}$As layer 15 are selectively etched away so as to leave a source region 21S, thus facing the P$^+$-GaAs layer 14 to the outer surface which will become the gate region. According to this selective etching process, the i-Al$_{0.4}$Ga$_{0.6}$As layer 15 is used as a stopper region to remove the n$^+$-GaAs layer 16 on the surface by the RIE method. Then, while the P$^+$-GaAs layer 14 is used as a stopper region, the i-Al$_{0.4}$Ga$_{0.6}$As layer 15 is removed by the wet etching process. At that time, the P$^+$-GaAs layer 14 may be etched away by the depth of about 2 to 300 Å, producing no problem. Thereafter, a SiN layer 25 of about 500 Å thick is deposited on the whole surface.

Figure 2E:
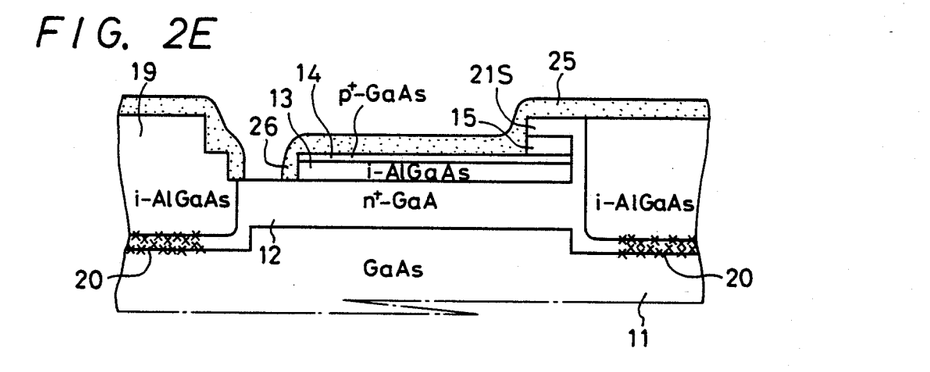

Next, as shown in FIG. 2E, parts of the P$^+$-GaAs layer 14 and the i-Al$_{0.4}$Ga$_{0.6}$As layer 13 which correspond to the electrode deriving portion of the n$^+$-GaAs layer 12 which becomes the drain region are selectively etched away. Then, a side wall 26 made of SiN is formed on the removed side surfaces.

Figure 2F:
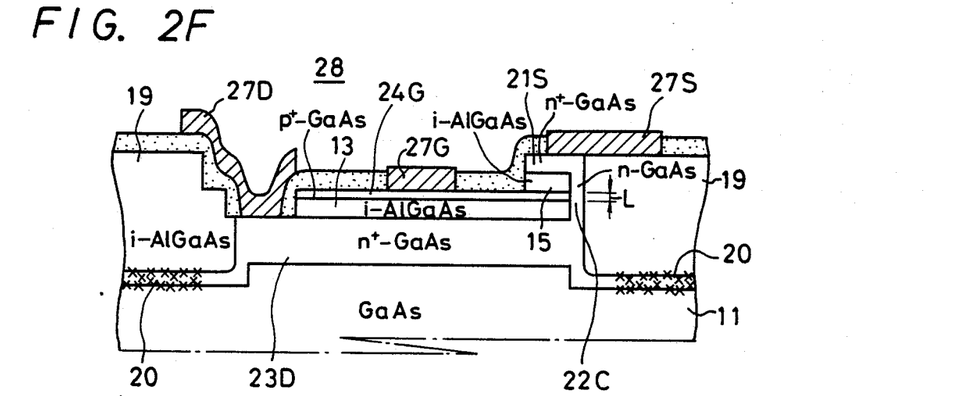

As shown in FIG. 2F, after a drain electrode 27D is formed adjacent to a drain region 23D which is made of the n$^+$-GaAs layer, the openings are formed to derive the source electrode and the gate electrode. Then, a source electrode 27S is formed adjacent to the source region 21S of n$^+$-GaAs layer and a gate electrode 27G is formed adjacent to a gate region 24G made of the P$^+$-GaAs layer. Thus, the drain region 23D, the i-Al$_{0.4}$Ga$_{0.6}$As layer 13, the gate region 24G, the i-Al$_{0.4}$Ga$_{0.6}$As layer 15 and the source region 21s are sequentially laminated. Thereafter, a channel region 22c is formed across one side wall of the thus laminated layer, forming a vertical J-FET 28.

Figure 3:
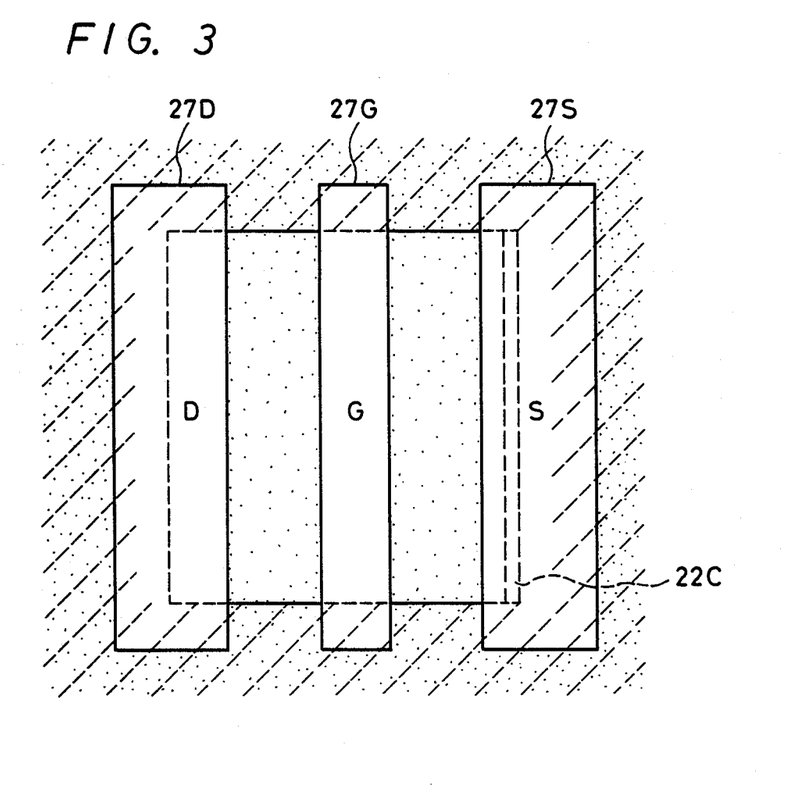
FIG. 3 is a plan view of the embodiment shown in FIG. 2F according to the present invention.

FIG. 3 is a plan view of FIG. 2F. As shown in FIG. 3, since the n-GaAs layer 18, which becomes the channel region, is formed after the selective etching of other portions except the active region is made grown again to thereby form the channels on four side walls of the active region, the carrier of three walls is cancelled out by the ion implantation of boron B$^+$ to thereby form the channel region 22C only on the one surface. The element separating region 20 formed by the ion implantation of boron B$^+$ is shown by the hatching and the SiN layer 25 is shown by dots.

While in this embodiment the present invention relates to a J-FET of normaly-on type (depletion mode) in which the film thickness of the channel region 22c is about 500 Å, if the film thickness of the channel region 22C is selected to be about 250 Å, it is possible to obtain a J-FET of normally-off type (enhancement mode).

Further, the i-Al$_{0.4}$Ga$_{0.6}$As layers 13 and 15 provided among the gate region 24G, the source region 21S and the drain region 23D may be replaced with an i-GaAs layer.

With the above arrangement, the i-AlGaAs layers 13 and 15 provided among the gate region 24G, the source region 21S and the drain region 23D are used to reduce the gate capacitance. Since the area between the drain region 23D and the gate region 24G is large, the film thickness of the i-AlGaAs layer 13 is increased to the amount of 1000 Å. In this case, the increase of the drain resistance cannot greatly affect the element characteristic. In this embodiment, the resistance is not increased.

The length from the end of the source region 21S to the end of the gate region 24G at the drain region 23D s selected to be less than 1000 Å, so that electrons can move at very high speed. Accordingly, the speed of the electons is increased to be higher than that of the conventional theory via the velocity overshoot. Thus, there is a possibility that the mutual conductance gm will be increased. While the channel region is arranged to have the impurity concentration of n=$3 \times 10^{18}$, this impurity concentration makes the plasmon effect extreme. Thus, if the impurity concentration is selected to be n$\leq 10^{18}$, the very high speed operation property is increased.

The gate length L does not depend on the rule of lithography but is determined by the film thickness of the gate region 24G (accordingly, P$^+$-GaAs layer 14). In this embodiment, the film thickness is selected to be 500 Å but can be selected to be less than 500 Å (for example, 200 Å). Further, the gate length L can be decreased as much as possible. Since the gate-source capacitance affects the area of the gate region 24G considerably, the line-lithography rule is desired to be as small as possible in order to reduce the gate-source capacitance. However, in order to reduce the gate capacitance, it is more effective to make the thickness of the i-AlGaAs layer 13 between the drain and gate, for example, 3000 Å. According to this arrangement, the line rule is determined from an integration density standpoint (one layer/cm$^2$) and is not related to the efficiency of the speed.

With the above-mentioned arrangement, since the intrinsic gate length L is determined by the film thickness of the P$^+$-GaAs layer 14, the gate length L can be reduced as much as possible. In the gate region 24G, its side surface in the widthwise direction contacts only with the channel region 22C and the upper and lower surfaces of the gate region 24G are respectively separated by i-AlGaAs layers 15 and 13, from the source region 21S and the drain region 23D. Accordingly, the extra side capacitance can be suppressed and hence the gate capacitance can be reduced. Further, since the i-AlGaAs layer 19 (or SiN insulating layer) having a wide bandgap is formed at the opposite side of the gate region 24G to the channel region 22C, when the gate is closed, a current can be prevented from flowing through the layer 19 provided just beneath the channel. Thus, the short-channel effect can be suppressed, and hence it is possible to obtain a vertical J-FET of high efficiency.

Figure 4A:
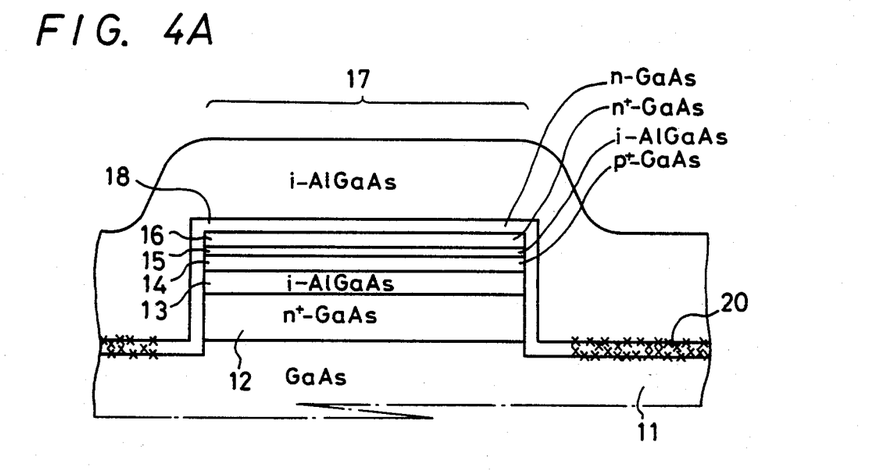
FIGS. 4A through 4E are respectively process diagrams illustrating another embodiment of the junction field effect transistor according to the present invention.

A second embodiment of this invention will be described hereinafter. As shown in FIG. 4A, similarly to the first embodiment, an n$^+$-GaAs layer 12, an i-Al$_{0.4}$Ga$_{0.6}$As layer 13, a P$^+$-GaAs layer 14, an i-Al$_{0.4}$Ga$_{0.6}$As layer 15 and an n$^+$-GaAs layer 16 are sequentially formed on a semi-insulating GaAs substrate 11 by the MOCVD method. Thereafter, other portions than the active region portion 17 are removed by the RIE etching process. Then, the damaged layer is removed by the wet etching method and an n-GaAs layer 18 is grown again by the MOCVD method. Furthermore, a SiN layer 30 is deposited and the ion-implantation of boron B$^+$ is carried out to thereby form the element separating region 20.

Figure 4B:
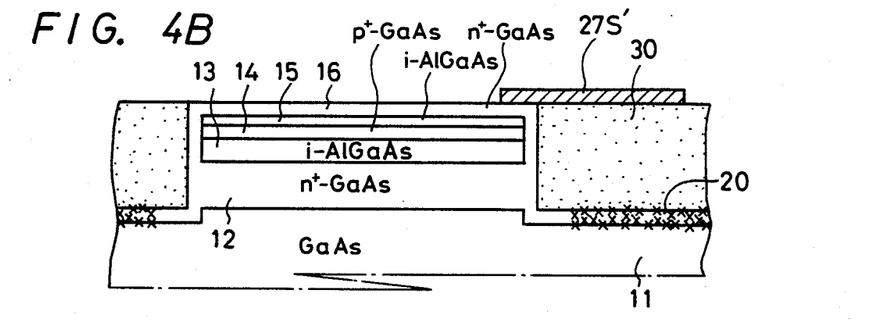

Then, as shown in FIG. 4B, after the photo-resist layer is coated on the whole surface, the whole surface is made flat by the RIE method and the n$^+$-GaAs layer 16 of the active region 17 has its faced on the outer surface. Then, a source electrode 27S' is formed across the SiN layer 30 from the n$^+$-GaAs layer 16.

Figure 4C:
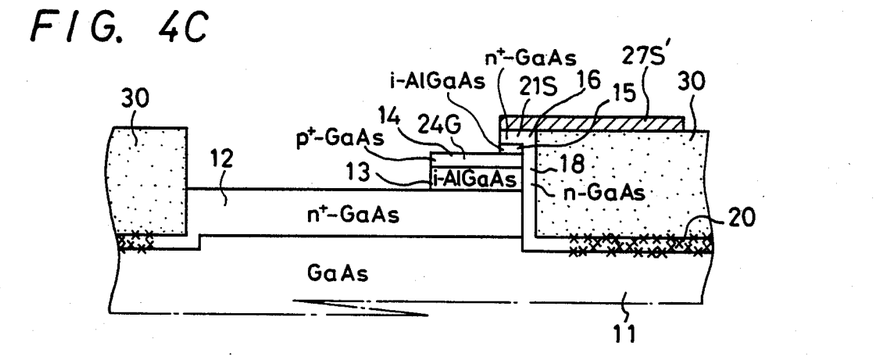

As shown in FIG. 4C, the n$^+$-GaAs layer 16 and the i-AlGaAs layer 15 are removed by the etching method similarly to the above-mentioned example so as to leave the source region 21S formed just below the source electrode 27S'. Further, the P$^+$-GaAs layer 14 and the i-AlGaAs layer 13 are removed by the selective etching method so as to leave the gate region 24G having a predetermined dimension (relatively small dimension) larger than the source region 21S.

Figure 4D:
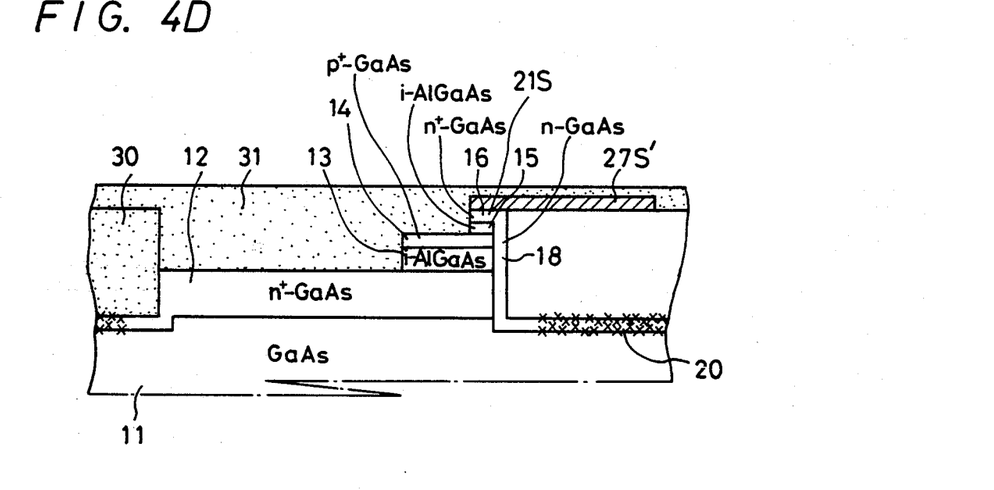

Subsequently, a SiN layer 31 is deposited on the whole surface on which the photo-resist layer is coated and then made flat by the RIE method (see FIG. 4D).

Figure 4E:
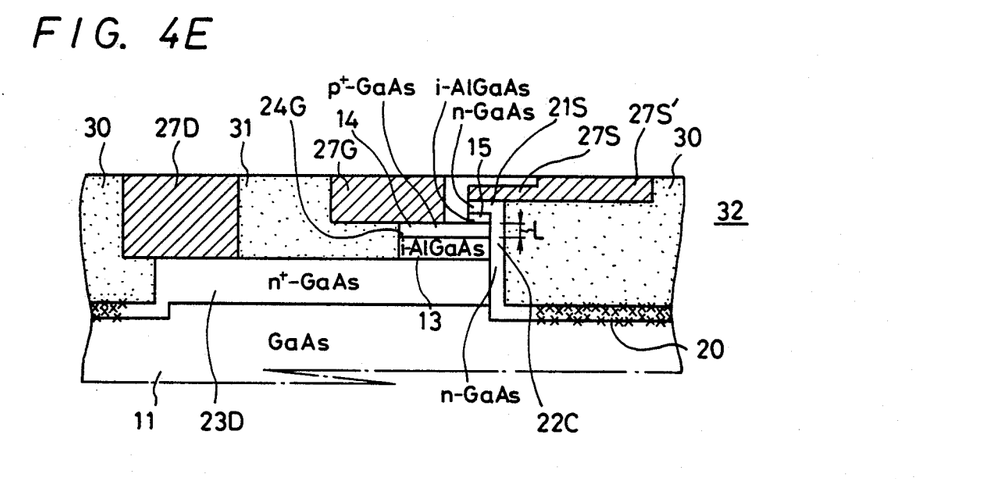

As shown in FIG. 4E, the windows are formed to derive the source electrode, the gate electrode and the drain electrode and then the source electrode 27S which contacts with the source electrode 27S', the gate electrode 27G which contacts with the gate region 24G and the drain electrode 27D which contacts with the drain region 23D are formed, respectively. Thus, a vertical J-FET 32 can be obtained, in which the drain region 23D, the i-AlGaAs layer 13, the gate region 24G, the i-AlGaAs layer 15 and the source region 21S are deposited sequentially and the channel region 22C is formed on one side surface which is formed across the laminated layer.

Also in accordance with this arrangement, since the gate length L can be decreased as much as possible, the gate capacitance and the short-channel effect can be suppressed considerably. Thus, the action and effect similar to those of the embodiment of FIG. 2 can be achieved, and in addition, according to this embodiment, the element can be made flat.

According to the present invention, as set forth above, since the source region, the gate region and the drain region are laminated and the channel region is formed on one side surface across the laminated layers, the intrinsic gate length is determined by the film thickness of the laminated gate region. Thus, the gate length can be reduced as much as possible (for example, 200 Å) without the line-lithography technique. When the intrinsic semiconductor layers are laminated to grip the upper and lower surfaces of the gate region, the gate capacitance can be reduced. Furthermore, when the intrinsic semiconductor or the insulating layer having a bandgap wider than that of the channel region is formed adjacent to the channel region at its opposite side to the gate region, the short-channel effect can be suppressed.

Therefore, it is possible to obtain a junction field effect transistor of which the operation speed can be increased considerably.

Figure 5:
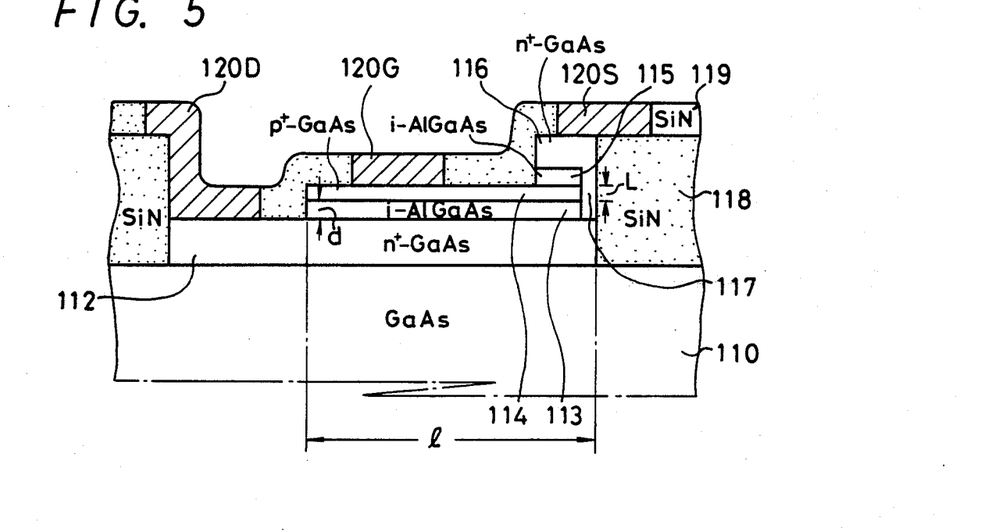
FIG. 5 is a cross-sectional view of the vertical junction field effect transistor of the present invention used to explain another embodiment of the present invention.

However, the above mentioned embodiment of the J-FET according to the present invention cannot overcome the shortcomings which will be described below with reference to FIG. 5. FIG. 5 illustrates such a vertical J-FET in which the intrinsic gate length can be reduced as much as possible without using lithography. As shown in FIG. 5, this J-FET is formed as follows. On a semi-insulating GaAs substrate 110, there are sequentially deposited an n$^+$-GaAs drain region 112, an i-AlGaAs intrinsic semiconductor layer 113, a P$^+$-GaAs gate region 114, an i-AlGaAs intrinsic semiconductor layer 115 and an n$^+$-GaAs source region 116 and n$^+$-GaAs active region or channel region 117 is formed on the side surface across the thus laminated layers. There are formed, for example, SiN layers 118, 119, a source electrode 120S, a gate electrode 120G and a drain electrode 120D, respectively.

According to this arrangement, the gate length L is not dependent upon the line-lithography technique and is shortened by the film thickness of the gate region 114. Thus, the gate length L can be reduced as much as possible and the mutual conductance gm can be increased considerably. In accordance with this embodiment, however, the parasitic capacitance of the gate, that is, the external gate capacitance is brought about from a structure standpoint. In other words, since the gate length L is the film thickness (for example, about 0.1 μm) of the P$^+$-GaAs gate region 114, the intrinsic gate capacitance just beneath the channel region 116 is smaller than that of the conventional FET (field effect transistor). However, the junction between the gate region 114 and the source region 115 and the junction between the gate region 114 and the drain region 113 are each separated by the i-AlGaAs intrinsic semiconductor layers 113 and 115 having a film thickness ranging from one-fifth to one-sixth of one micrometer, so that the external parasitic capacitance occurs therein. If the spacing between the gate and drain, that is, the film thickness d of the i-AlGaAs intrinsic semiconductor layer 113 is selected to be 0.3 μm, the gate width (the width in the direction perpendicular to the sheet of the drawing) is selected to be 10 μm and the distance l from the portion just beneath the channel region 117 to the end of the P+-GaAs gate region 114 is selected to be 3 μm, the capacitance Cgd between the gate and the drain is expressed as $$Cgd = \frac{K\epsilon_0 Z}{d}$$

$$= \frac{12 \times 8.86 \times 10^{-14} (F/cm) \times 10 \times 10^{-4} cm \times 3 \times 10^{-4} cm}{0.3 \times 10^{-4} cm}$$

$$\approx 10^{-14} F = 10 fF$$

In this connection, if the gate capacitance Cg of the normal gate length (gate width is 10 μm) of 1 μm is calculated, this is expressed as follows:

$$Cg = \frac{12 \times 8.86 \times 10^{-14} (F/cm) \times 10^{-4} \times 10 \times 10^{-4} cm^2}{0.1 \times 10^{-4} cm}$$

$$\approx 10 fF$$

where the depletion layer is selected to be 0.1 μm. Accordingly, the vertical J-FET of FIG. 5 has a gate capacitance not so different from that of the normal J-FET having a gate length of 1 μm.

Therefore, the third embodiment of the present invention can improve the vertical J-FET of FIG. 5 and provide a J-FET in which the external gate capacitance can be reduced and gm/Cg can be increased so that its operation speed can be made very high.

Now, the third embodiment of the J-FET according to the present invention and the manufacturing method thereof will be described with reference to FIGS. 6A to 6F. FIGS. 6A to 6F are respectively process diagrams of this embodiment.

Figure 6A:
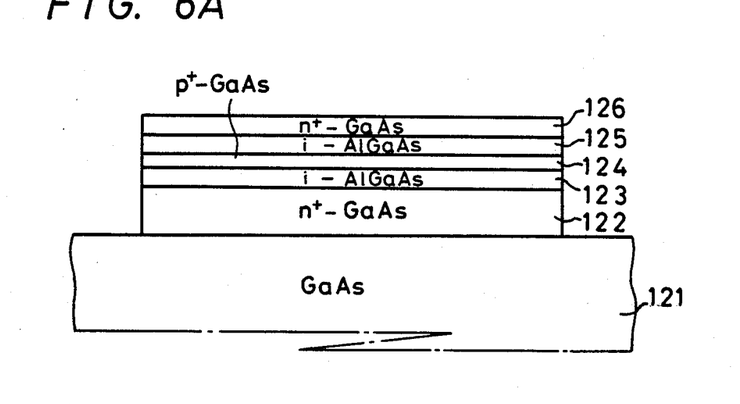
FIGS. 6A to 6F are respectively process diagrams illustrating further embodiment of the vertical junction field effect transistor according to the present invention.

As shown in FIG. 6A, on a semi-insulating GaAs substrate 121, there are sequentially deposited an n+-GaAs layer 122 with a thickness of about 0.5 μm and having the impurity concentration of about 5×10¹⁸ cm⁻³ which becomes a drain region, an i-Al₀.₆Ga₀.₄As layer 123 of about 0.3 μm thick, a P+-GaAs layer 124 of about 0.1 m thick and having an impurity concentration of about 2×10¹⁹ cm⁻³ which becomes a gate region, an i-Al₀.₆Ga₀.₄As layer 125 of about 0.1 μm thick and an n+-GaAs layer 126 of about 0.2 μm thick and having an impurity concentration of about 5×10¹⁸ cm⁻³ which becomes a source region by the MOCVD (metal organic chemical vapor deposition) method. Then, portions of the respective layers 122 to 126 other than the element forming portions are selectively etched (mesa-etched) away up to the substrate 121 by, for example, the RIE (reactive ion etching) method.

Figure 6B:
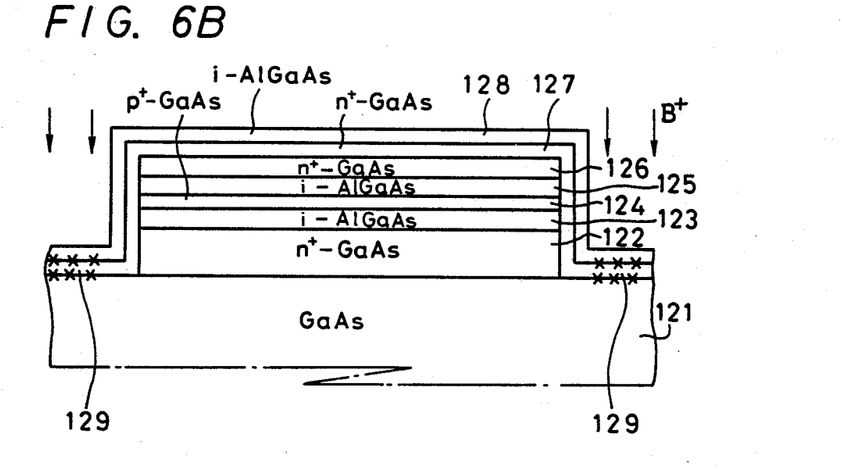

Thereafter, as shown in FIG. 6B, the laminated layers are slightly etched by, for example, the wet etching process to thereby remove the damage layer, and then the layers are grown again by the MOCVD method, whereby an n+-GaAs layer 127 of anout 500 Å thick of which the impurity concentration is about 3×10¹⁸ cm⁻³ and an i-Al₀.₃Ga₀.₇As layer 128 of about 500 Å thick are deposited sequentially. Then, an element separating region 129 is formed by the ion implantation of, for example, boron ion B+ on the region adjacent to the element forming region.

Figure 6C:
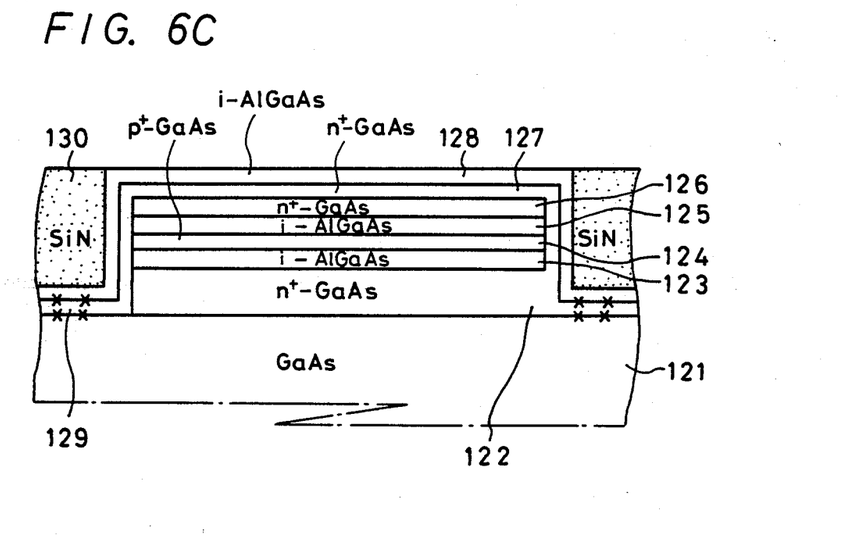

As shown in FIG. 6C, an SiN layer 130 is formed on the whole surface and then made flat by the RIE process. At that time, the i-AlGaAs layer 128 is on to the surface in the element forming region.

Figure 6D:
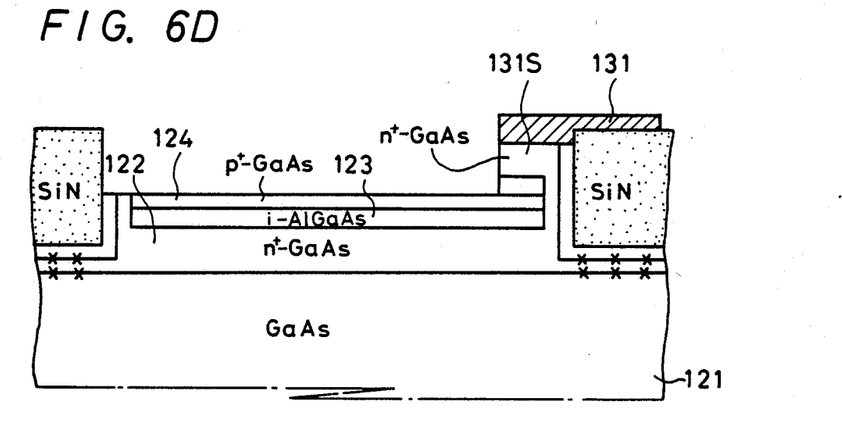

As shown in FIG. 6D, after the i-AlGaAs layer 128 facing the surface is removed by the wet etching, a source electrode metal (AuGe) 131 is deposited adjacent to the n+-GaAs layer 127. Then, employing this source electrode metal 131 as a mask, the n+-GaAs layers 126 and 127 and the i-AlgaAs layer 125 beneath them are selectively etched away so as to leave a source region 131S to thereby cause the P+-GaAs layer 124 which becomes a gate region to be faced to the surface. This selective etching will be performed such that employing, for example, the i-Al₀.₆Ga₀.₄As layer 125 as a stopper, the n+-GaAs layers 126 and 127 are removed by the wet etching process and then the i-Al₀.₆Ga₀.₄As layer is removed by the wet etching process, employing the P+-GaAs layer 124 as a stopper.

Figure 6E:
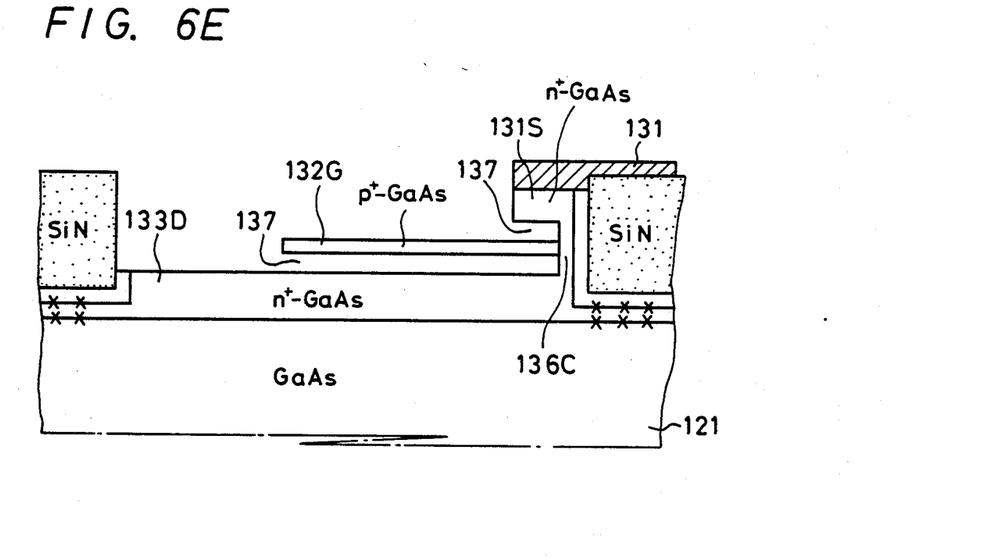

Thereafter, as shown in FIG. 6E, the P+-GaAs layer 124 and the i-AlGaAs layer 123 beneath the layer 124 are selectively etched away so as to leave a gate region 132G. Then, the whole of the substrate is immersed into HF solution at room temperature for 5 minutes and the i-Al₀.₆Ga₀.₄As layer 125 between the source region 131S and the gate region 132G and the i-Al₀.₆Ga₀.₄As layer 123 between the gate region 132G and an n+-GaAs drain region 133D are removed by the selective etching process to thereby form cavities 137.

Figure 6F:
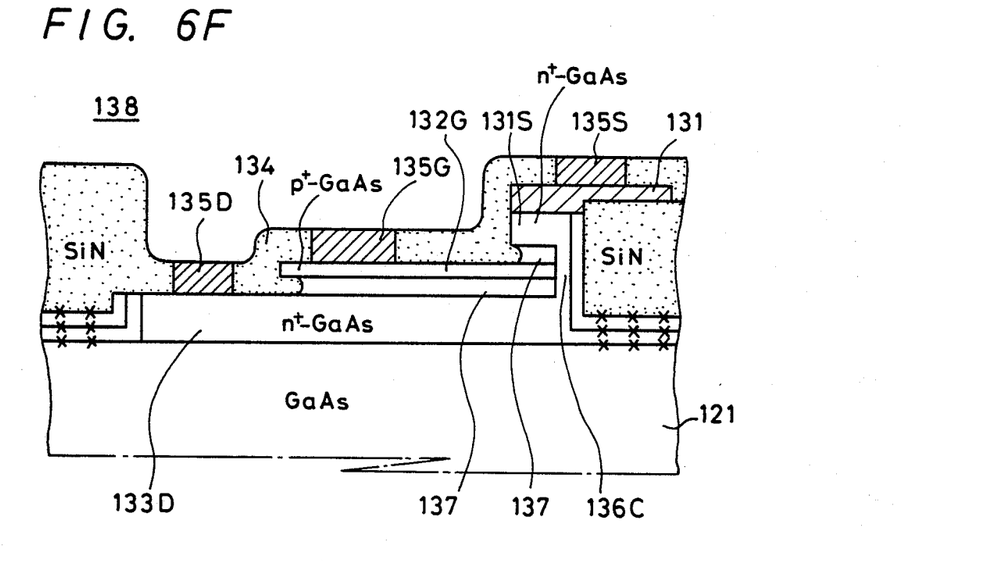

Then, a SiN layer 134 of about 0.5 μm thick is formed on the whole surface and thereafter, the electrode windows are formed to thereby form a drain electrode 135D, a gate electrode 135G and a source electrode 135S which respectively contact with the drain region 133D, the gate region 132G and the source electrode metal 131 in ohmic contact. Thus, it is possible to obtain a vertical J-FET 138 in which, as shown in FIG. 6F, the drain region 133D, the gate region 132G and the source region 131S are laminated, a channel region 136C is formed on one side surface formed across the laminated layers and the cavities 137 are respectively formed between the source region 131S and the gate region 132G and between the gate region 132G and the drain region 133D.

The main difference between the J-FET 138 of this embodiment and the J-FET shown in FIG. 5 exists in the etching of the Al₀.₆Ga₀.₄As layers 125 and 123 using the HF solution in the process of FIG. 6E. It was experimentally confirmed that the HF solution was effective for selectively etching the Al$_X$Ga$_{1-X}$As where X≧0.35 and it was substantially impossible to etch the Al$_X$Ga$_{1-X}$As where X<0.35.

Figure 7:
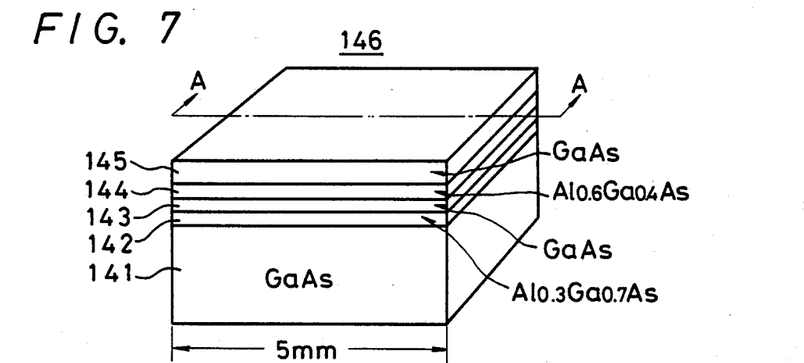
FIG. 7 is a perspective view of a sample used to measure the selective etching property of the HF solution to etch the AlGaAs layer.

FIG. 7 is a perspective view of a sample used to measure the selective etching property of the HF solution to etch the AlGaAs layer. As illustrated in FIG. 7, the sample is formed as follows. On a GaAs substrate 141, there are sequentially formed an Al₀.₃Ga₀.₇As layer 142 of 0.2 μm thick, a GaAs layer 143 of 0.2 μm thick, an Al₀.₆Ga₀.₄As layer 144 of 0.2 μm thick and a GaAs layer 145 of 0.4 μm thick by the MOCVD method. The thus grown sample was sliced into a 5×5 mm square substrate 146. This substrate 146 was immersed into the HF solution at 60° C. for 15 minutes.

Figure 8:
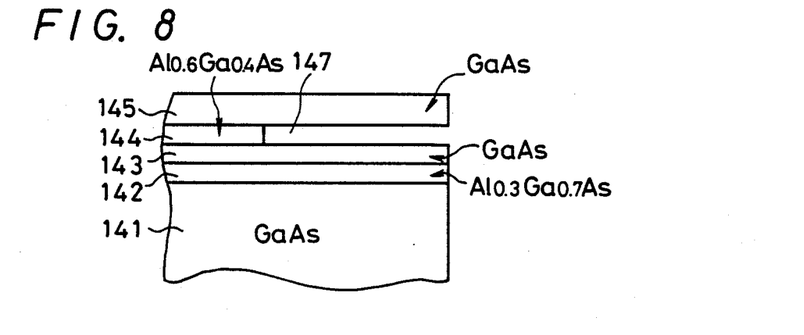
FIG. 8 is a cross-sectional view taken along a line A—A in FIG. 7 and which is a scanning electron microscopy photograph.

FIG. 8 is a cross-sectional view taken along a line A—A of FIG. 7 of SEM (scanning electron microscopy) photograph of the researched results of the selective etching property of the HF solution relative to the AlGaAa layer. From FIG. 8, it was apparent that the Al₀.₆Ga₀.₄As layer 144 was etched and a cavity 147 was formed but the GaAs layers 145, 143 above and beneath the layer 144 and the Al₀.₃Ga₀.₇As layer 142 were not etched at all.

In the above-mentioned vertical J-FET 138, the intrinsic gate length L is determined by the film thickness of the P+-GaAs layer 124 so that it can be reduced as much as possible (less than 0.1 μm and for example, 200 Å). Since only the side wall of the gate region 132G in the widthwise direction contacts with the channel region 136C, the extra side capacitance can be suppressed and hence the intrinsic gate capacitance can be reduced.

According to the third embodiment of the present invention, particularly, the layers above and below the P+-GaAs gate region 132G are formed as the cavities 137. When the cavities 137 are of, for example, an air layer, the dielectric constant of air is about 1 which is about 1/12 of the dielectric constant of the GaAs layer. Accordingly, as compared with the vertical J-FET of FIG. 5, the external gate capacitance is decreased to 1/12 simply. In other words, if the P+-GaAs gate region 132G is in a size of 3 μm × 10 μm, the external gate capacitance becomes less than 1 fF. This external gate capacitance is less than 1/10 of the gate capacitance of the standard FET. The cavities 137 may be fulfilled by other gases or vacuum.

Therefore, the third embodiment of the present invention can increase the gm/Cg by an order of magnitude as compared with that of the vertical J-FET shown in FIG. 5. Hence, it is possible to obtain a vertical J-FET which can be operated at ultra high speed.

According to the third embodiment of the present invention, since the i-AlGaAs layer 128 of wide bandgap is formed at the opposite side of the channel region 136C, when the gate is closed, a current can be prevented from flowing through the layer formed just beneath the channel so that the short-channel effect can be suppressed.

Further, the length from the end of the source region 131S to the end of the gate region 132G at the drain side can be selected to be very short, for example, less than 1000 Å, so that electrons can be moved at very high speed. Thus, the electron speed may become larger and gm will be increased. While the channel region 136C has the impurity concentration of $n = 3 \times 10^{18}$, this impurity concentration may make the effect of plasmon scattering become remarkable. Accordingly, if the impurity concentration is selected to be $n \leq 10^{18}$, the operation speed may be increased.

According to the third embodiment of the present invention, as set forth above, there is provided a J-FET in which the source region, the gate region and the drain region are laminated on the substrate, the active region is formed on one side of the laminated layers in the direction perpendicular to the surface of the substrate and the gate length can be formed to be very short without the line-lithography technique. In this case, since the high impurity concentration region in the gate region contacting with the active region and the high impurity regions of the source and the drain regions are separated by the cavities, the external parasitic gate capacitance can be reduced. Thus, it is possible to obtain the vertical J-FET in which gm/Cg is increased to thereby achieve a high speed property. The above description is given on the preferred embodiments of the invention but it will be apparent that many modifications and variations could be effected by one skilled in the art without departing from the spirits or scope of the novel concepts of the invention so that the scope of the invention should be determined by the appended claims only.

I claim as my invention:

1. A junction field effect transistor comprising;
a source region comprising a semiconductor layer, a gate region comprising a semiconductor layer, and a drain region comprising a semiconductor layer, said source, gate and drain regions formed in overlapping parallel layers with said gate region between said source and drain regions, to make up a laminated structure, said laminated structure having a side surface transverse to said layers, and
a channel region formed by said side surface across said laminated structure, said channel region juxtaposed with the edge of said gate region.

2. A junction field effect transistor according to claim 1, in which said source, gate and drain regions comprise regions of impurity concentrations, and further comprising a cavity which separates the impurity concentration regions of said source, gate and drain regions.

* * * * *